United States Patent [19]

Huang et al.

[11] Patent Number: 5,856,932

[45] Date of Patent: Jan. 5, 1999

[54] METHOD AND SYSTEM FOR PERFORMING QUANTITATIVE SNEAK CIRCUIT ANALYSIS

[75] Inventors: Henry Heping Huang, Canton; Herman McKenzie, Jr., Grosse Pointe Park; Shaun S. Devlin, Franklin; Thomas Anthony Spoto, Birmingham, all of Mich.

[73] Assignee: Ford Global Technologies, Inc., Dearborn, Mich.

[21] Appl. No.: 787,192

[22] Filed: Jan. 22, 1997

[51] Int. Cl.[6] .................................................. G06F 17/50
[52] U.S. Cl. .......................... 364/578; 364/490; 371/22.1
[58] Field of Search .................................. 364/578, 489, 364/490; 371/22.1

[56] References Cited

U.S. PATENT DOCUMENTS 3,774,051  11/1973  Chandler, Jr. .............................. 307/203

OTHER PUBLICATIONS

S.C.A.T. Sneak Circuit Analysis Tool User's Guide, Version 3.0, SoHaR Incorporated, Beverly Hills, CA, 105 pages.

*Primary Examiner*—Kevin J. Teska
*Assistant Examiner*—Thai Phan
*Attorney, Agent, or Firm*—Mark L. Mollon; Roger L. May

[57] ABSTRACT

A method and system for determining bi-directional sneak current paths of an electrical/electronic circuit. The electrical/electronic circuit is converted into a corresponding schematic having a plurality of components and a plurality of line segments. A segment identifier is then inserted into each of the plurality of line segments. Next, a DC analysis is performed on the electrical/electronic schematic for each possible switch position combination to obtain a current value for each of the plurality of components. Bi-directional sneak current paths are then determined based on the plurality of segment identifiers and the current value for each of the plurality of components.

19 Claims, 6 Drawing Sheets

METHOD AND SYSTEM FOR PERFORMING QUANTITATIVE SNEAK CIRCUIT ANALYSIS

TECHNICAL FIELD

This invention relates to methods and systems for performing quantitative sneak circuit analysis on electrical/electronic circuits.

BACKGROUND ART

A sneak circuit is an unexpected path or logic flow within a system which, under certain conditions, can initiate an undesired function or inhibit a desired function. The path may consist of hardware, software, operator actions, or combinations of these elements. Sneak circuits are not the result of hardware failure but are latent conditions inadvertently designed into the system, coded into the software program, or triggered by human error. Also excluded as causative factors are electrostatic, electromagnetic, or leakage paths as well as marginal parametric factors.

Adverse current conditions that can give rise to sneak circuits are mostly a result of external asynchronous inputs uncontrollable and often unforeseeable by the circuit designer. For example, the end-user may unexpectedly operate two switches simultaneously or out of sequence, an adverse current condition which the circuit designer may have never envisioned during the design phase. Another example might be the unexpected loss of one of several power sources in a circuit, possibly giving rise to unintended adverse current paths.

A known prior art method for performing sneak circuit analysis is the Sneak Circuit Analysis Tool (SCAT) developed by SoHar Inc. A user must identify input power sources and power sinks from a list of all ports in the design as well as define current flow directions for each port of each component. For example, a resistor has port A and B, and the current can flow from the port A to the port B and vice versa. A diode also has two ports, but current can only flow from the anode to the cathode. Before searching for bidirectional branches, a switch can be set to either a break-before-make or a make-before-break type, and a capacitor can be set to either open circuit or short circuit. SCAT then attempts to trace all possible paths from a source node to one or more sink nodes as previously defined. From among these paths, SCAT then determines the ones that allow current to flow bi-directionally through one or more of the components located along the path and highlights them accordingly for review by the user. Thus, SCAT requires manual input of current directions for each component by the user prior to performing sneak current analysis. Furthermore, SCAT fails to provide information regarding the amount of current that flows through the bi-directional path, i.e., SCAT performs qualitative sneak analyses only.

DISCLOSURE OF THE INVENTION

It is thus a general object of the present invention to provide a method and system for automatically performing a quantitative sneak circuit analysis on a circuit, such as electrical/electronic circuits.

In carrying out the above objects and other objects, features, and advantages of the present invention, a method is provided for determining sneak current paths of a circuit having a plurality of components, a plurality of line segments connecting the plurality of components, and at least one switch having at least one switch position. The method includes the step of determining a number of switch positions for the at least one switch of the circuit to identify all possible switch position combinations. The method also includes the step of inserting a segment identifier into each of the plurality of line segments. Still further, the method includes the step of performing a DC analysis on the circuit for each of the possible switch position combinations to obtain a current value for each of the plurality of components. Finally, the method concludes with the step of determining sneak current paths based on the plurality of segment identifiers and the current value for each of the plurality of components determined for each of the possible switch position combinations.

In further carrying out the above objects and other objects, features, and advantages of the present invention, a system is also provided for carrying out the steps of the above described method. The system includes an input tool for converting the circuit into a schematic having a plurality of components, a plurality of line segments connecting the plurality of components, and at least one switch having at least one switch position. The system also includes control logic operative to determine all possible switch position combinations for the at least one switch, insert a segment identifier into each of the plurality of line segments, perform a DC analysis on the schematic for each of the possible switch position combinations to obtain a current value for each of the plurality of components, and determine sneak current paths based on the plurality of segment identifiers and the current value for each of the plurality of components determined for each of the possible switch position combinations.

The above objects and other objects, features and advantages of the present invention are readily apparent from the following detailed description of the best mode for carrying out the invention when taken in connection with the accompanying drawings.

BEST MODES FOR CARRYING OUT THE INVENTION

Figure 1:
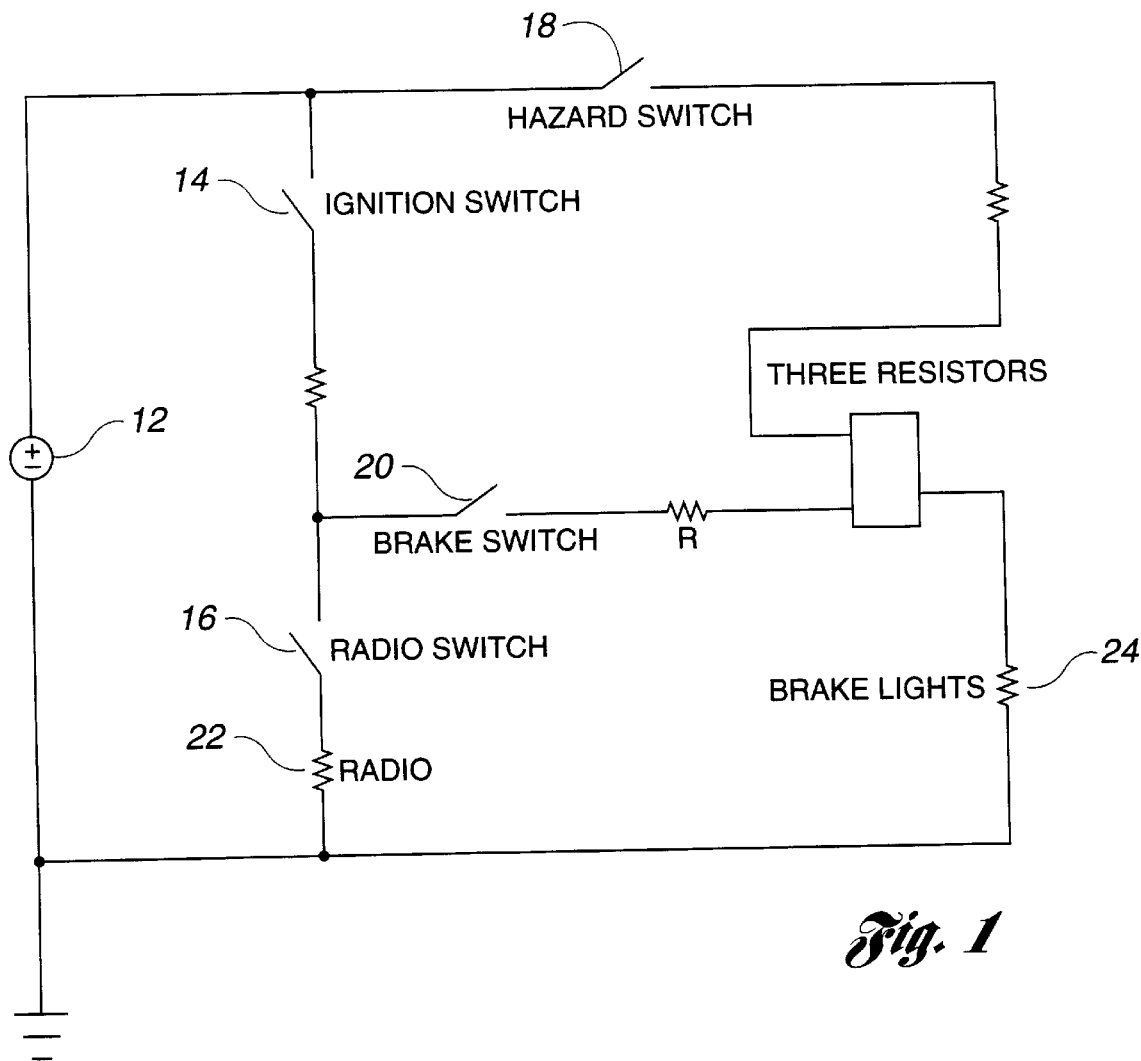
FIGS. 1 and 2 are examples of electrical circuits used in performing sneak circuit analysis.
Figure 2:
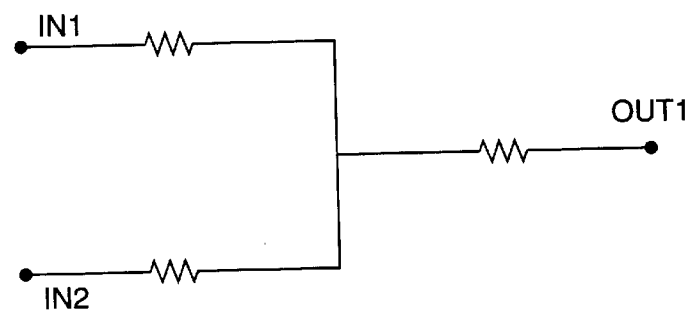

An example of an electrical/electronic circuit requiring sneak circuit analysis is shown in FIGS. 1 and 2, where FIG. 1 is an electrical circuit representative of a radio and brake lights installed in an automotive vehicle (not shown) and FIG. 2 is a three-resistor sub-circuit shown in FIG. 1. FIG. 1 includes a DC voltage supply 12, an ignition switch 14, a radio switch 16, a hazard switch 18 and a brake switch 20. When the ignition switch 14 is turned ON and the radio switch 16 is turned ON, a radio 22 is powered. When the hazard switch 18 is turned ON, a set of brake lights 24 are illuminated. Similarly, if the ignition switch 14 is turned ON and the brake switch 20 is turned ON, the brake lights 24 are illuminated.

Figure 3:
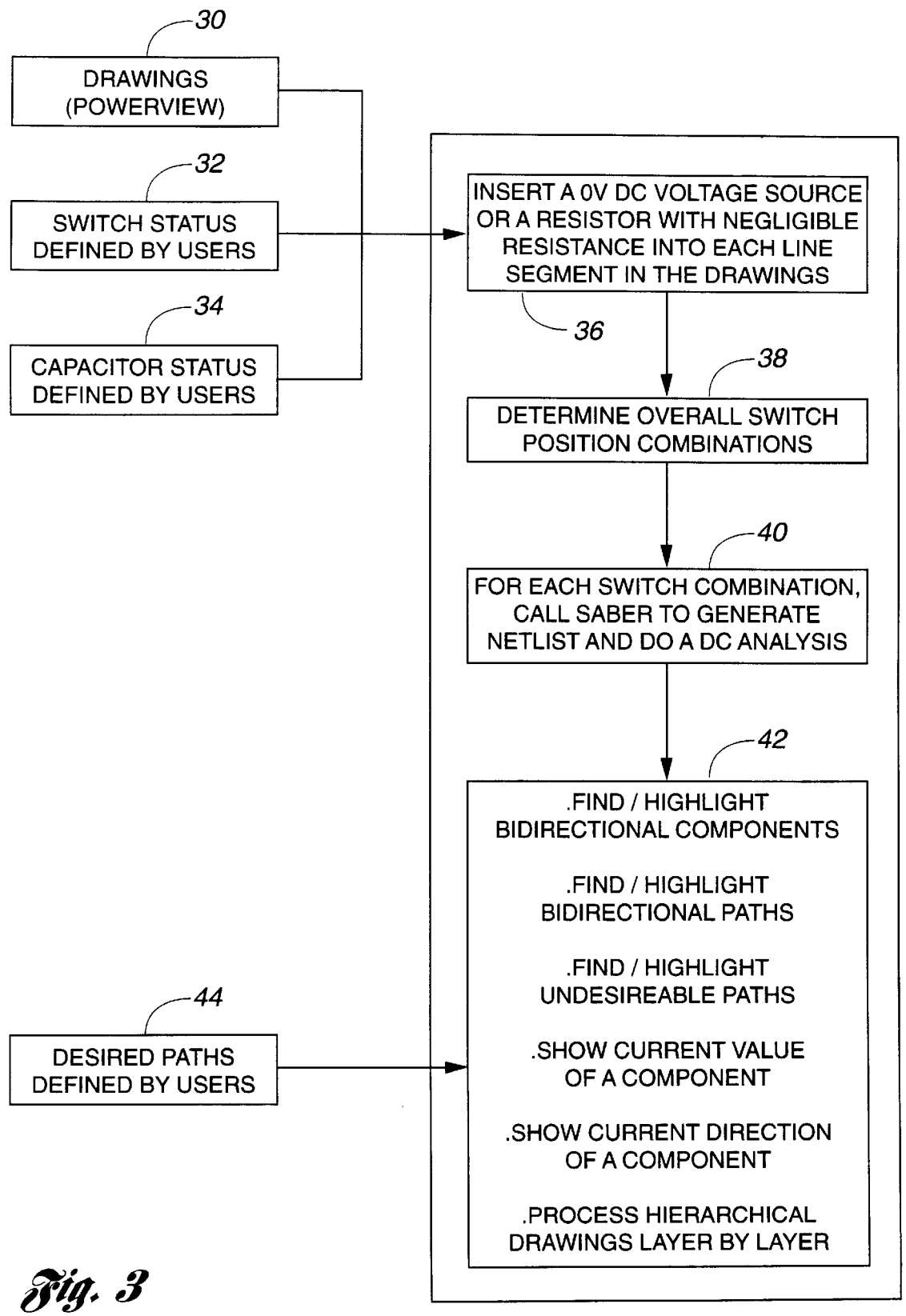
FIG. 3 is a block flow diagram illustrating the general sequence of steps associated with the operation of the present invention.

Turning now to FIG. 3, there is shown a block flow diagram illustrating the general sequence of steps associated with the operation of the present invention. First, drawings, or schematics, representative of the circuit to be analyzed are obtained, as shown at block 30. A schematic capture tool, such as Powerview from Viewlogic System, Inc., can be used to obtain the drawings.

Prior to analyzing the drawings, a user defines the switch status of each of the switches in the circuit, as shown at block 32. That is, the user defines the number of switch positions for each switch. For example, one switch may have two positions, while a second switch may have three positions. Next, the user may define the status of each capacitor, as shown at block 34. The user may define each capacitor in the circuit as either an open circuit or a short circuit, or, alternatively, all capacitors can be modeled as either open circuits or as short circuits.

Figure 4:
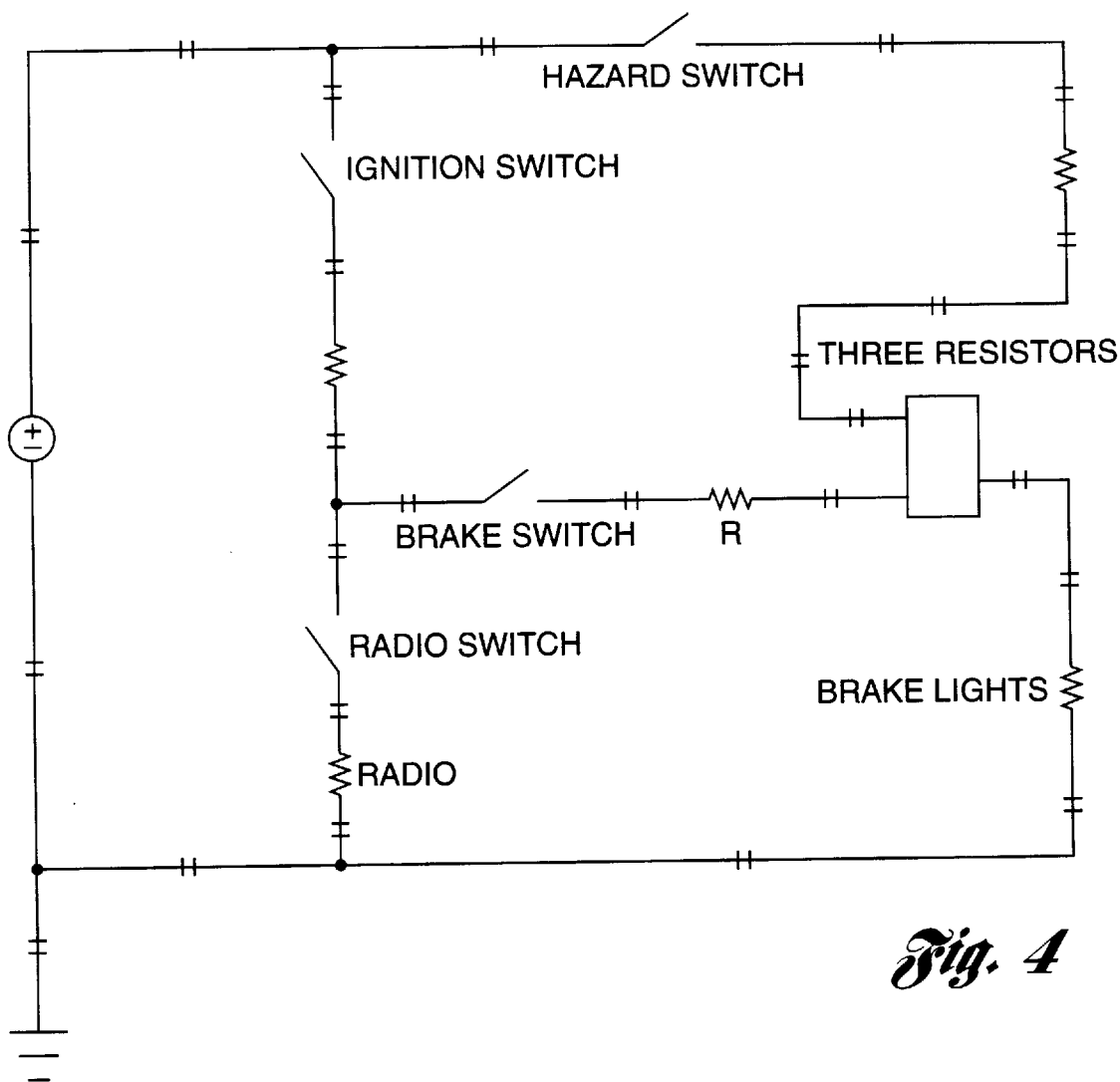
FIG. 4 is the circuit of FIG. 1 in which a negligible resistance has been inserted into each segment.

The method of the present invention proceeds with the step of inserting a segment identifier, such as a small DC voltage source (Ov DC) or a resistor with negligible resistance, into each line segment in the drawings, as shown at block 36. This step is useful in determining if there is a current through a particular segment of the electrical circuit. This step, as it is performed on the circuit of FIG. 1, is shown in FIG. 4.

All possible switch position combinations are then identified as shown at block 38, so that a DC analysis can be performed for each switch position combination. All possible switch combinations for the circuit are identified based on the user-defined switch status for each individual switch. For example, there are four switches in the electrical circuit of FIG. 1, and each switch has two positions, open or close. Therefore, the total number of DC analyses required is $2^4$, or 16.

A "netlist" is then generated and a DC analysis for every switch position combination is performed, as shown at block 40. In order for the present invention to understand component definitions and the interconnectivity between components, a netlist has to be generated. A netlist is a text file created by a schematic editor utility and can be generated in various different formats. The Powerview schematic capture tool described above generates the necessary netlist from the pre-processed schematics. The DC analyses is preferably performed utilizing a circuit simulation tool, such as Saber from Analogy, Inc., which determines a current value at each branch and a voltage value at each node in the circuit.

Figure 5:
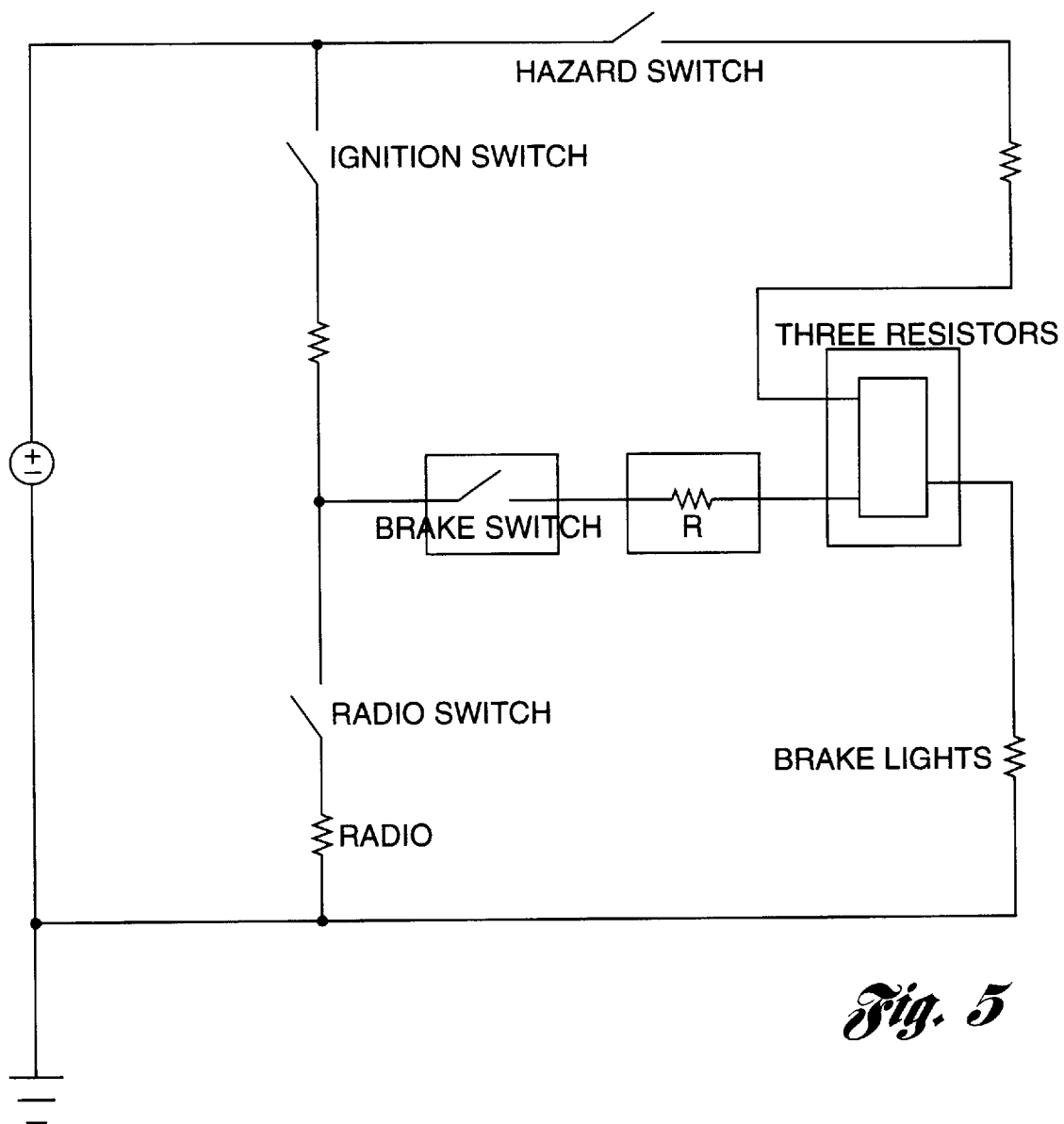
FIG. 5 is the circuit of FIG. 1 in which bi-directional components have been identified.

Based on the results of each of the DC analyses, the present invention identifies sneak current paths by determining bi-directional components and paths, as shown at block 42. Bi-directional components are components that can conduct current in one direction at one set of switch positions and can conduct current in an opposite direction at another set of switch positions. That is, the current value for one set of switch positions is positive, while at another set of switch positions, the current value is negative. FIG. 5 illustrates the bi-directional components of the electrical circuit of FIG. 1, i.e., the three-resistor sub-circuit, a resistor R, and the brake switch 20.

Figure 6:
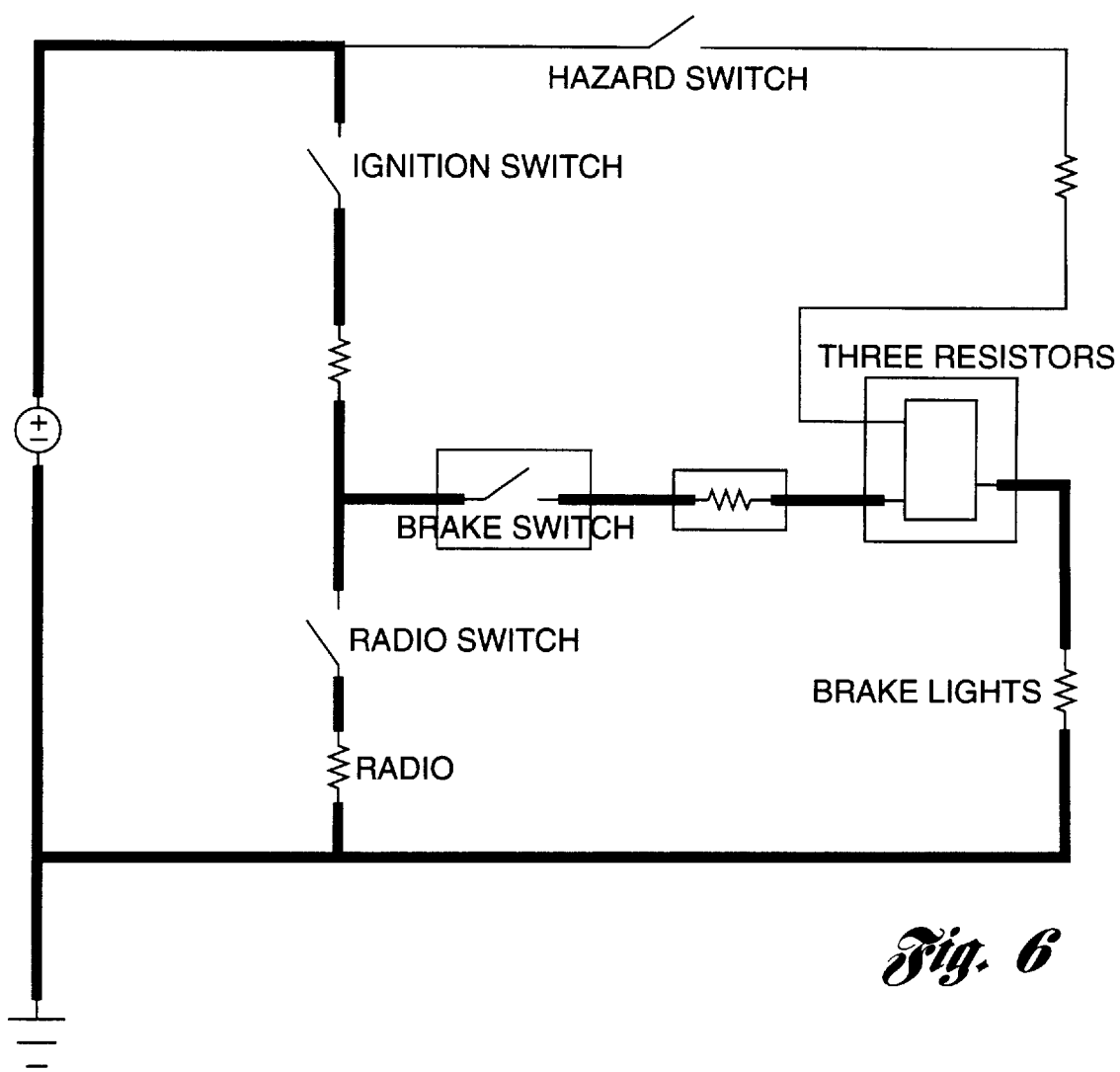
FIG. 6 is the circuit of FIG. 1 with a highlighted bi-directional path.

Bi-directional paths are then identified based on each of the line segments and the current value of the bi-directional components. FIG. 6 is an example of the circuit of FIG. 1 wherein a bi-directional path is highlighted. The path is found by determining if a current value is present in each of the segments for a particular switch position. If so, then the corresponding component is part of the path. If not, then the component is not part of the path.

After a bi-directional path is identified, the current value and direction of each component is further provided to the user to determine if it is actually a sneak current path.

Figure 7:
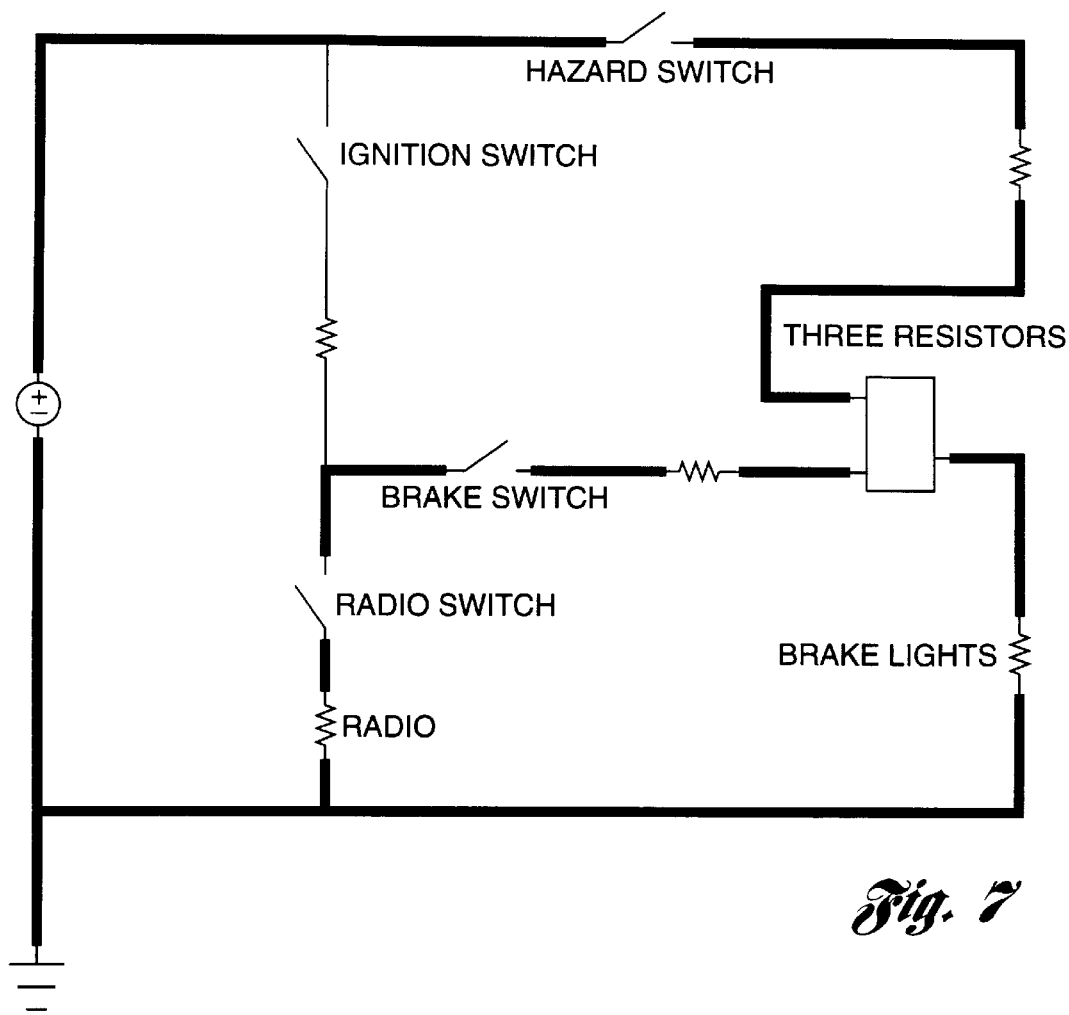
FIG. 7 is the circuit of FIG. 1 with a highlighted undesirable path.

The user may pre-define desired paths, as shown at block 44. Typically, a component functions correctly only when certain switches are at certain positions. These positions can be defined as desired paths. For example, a desired path for the radio 22 shown in FIG. 1 occurs if and only if the ignition switch 20 and the radio switch 22 are on. This desired path can then be defined as (Radio=On) if-and-only-if (Ignition Switch=On and Radio Switch=On). The present invention can then find all undesired paths for the Radio component based on the results of the DC analyses. For example, an undesired path is one in which the radio 22 is ON when the ignition switch 14 is OFF, as shown in FIG. 7. Thus, the desired path definitions are used as a filter for finding undesired paths.

Figure 8:
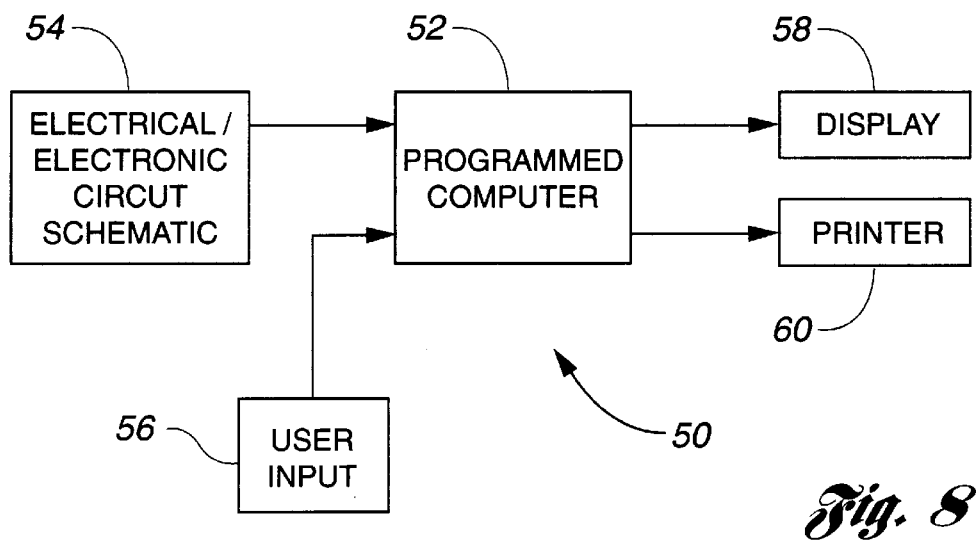
FIG. 8 is a block diagram of the preferred embodiment of the present invention.

Turning now to FIG. 8, there is shown a block diagram of the system of the present invention, denoted generally by reference numeral 50. The system 50 includes a programmed computer 52 having control logic to perform the method steps of the present invention. The programmed computer 52 receives an electrical/electronic circuit schematic 54 as an input, as well as a user input 56, such as switch status, capacitor status and desired paths. Finally, the system 50 includes a display 58 for displaying the results of the analyses of the electrical/electronic circuit schematic 54, including bi-directional paths, undesirable paths, and current values and directions of the components. Alternatively, the results of the DC analyses could be printed directly to a printing device 60, such as a printer.

While the best modes for carrying out the invention have been described in detail, those familiar with the art to which this invention relates will recognize various alternative designs and embodiments for practicing the invention as defined by the following claims.

What is claimed is:

1. A method for determining sneak current paths of a circuit having a plurality of components, a plurality of line segments connecting the plurality of components, and at least one switch having at least one switch position, the method comprising:

determining a number of switch positions for the at least one switch of the circuit to identify all possible switch position combinations;

assigning a segment identifier to each of the plurality of line segments identifying whether or not a current flows through the corresponding line segment;

performing a DC analysis on the circuit for each of the possible switch position combinations to determine a current value for each of the plurality of components; and determining sneak current paths based on the plurality of segment identifiers and the current value for each of the plurality of components determined for each of the possible switch position combinations.

2. The method as recited in claim 1 wherein determining sneak current paths includes determining if any of the plurality of components are bi-directional components based on the DC analysis performed for each of the possible switch position combinations.

3. The method as recited in claim 2 wherein determining sneak paths further includes determining bi-directional paths based on each line segment and the current value for each of the bi-directional components.

4. The method as recited in claim 1 wherein determining sneak current paths includes determining undesirable current paths of the circuit.

5. The method as recited in claim 4 wherein determining undesirable current paths includes identifying desired switch position combinations from all possible switch position combinations.

6. The method as recited in claim 1 further comprising displaying the sneak current paths.

7. The method as recited in claim 1 wherein the segment identifier includes a zero DC voltage source.

8. The method as recited in claim 1 wherein the segment identifier includes a resistor having negligible resistance.

9. A system for determining sneak current paths of a circuit comprising:
   an input capture tool for converting the circuit into a schematic having a plurality of components, a plurality of line segments connecting the plurality of components, and at least one switch having at least one switch position;
   a control logic operative to determine all possible switch position combinations for the at least one switch, assign a segment identifier to each of the plurality of line segments identifying whether or not a current flows through the corresponding line segment, perform a DC analysis on the schematic for each of the possible switch position combinations to determine a current value for each of the plurality of components, and determine sneak current paths based on the plurality of segment identifiers and the current value for each of the plurality of components determined for each of the possible switch position combinations.

10. The system as recited in claim 9 wherein the control logic is further operative to determine if any of the plurality of components are bi-directional components based on the DC analysis performed each of the possible switch position combinations in determining the sneak current paths.

11. The system as recited in claim 10 wherein the control logic is further operative to determine bidirectional paths based on each line segment and the current value for each of the bi-directional components in determining the sneak current paths.

12. The system as recited in claim 9 wherein the control logic is further operative to determine undesirable current paths based on desired switch position combinations in determining the sneak current paths.

13. The system as recited in claim 9 further comprising a display for displaying the sneak current paths.

14. The system as recited claim 9 further comprising a printer for printing the sneak current paths.

15. The system as recited in claim 9 wherein the input tool is a Powerview schematic capture tool.

16. The system as recited in claim 9 wherein the control logic includes a circuit simulation tool to perform the DC analyses.

17. The system as recited in claim 16 wherein the circuit simulation tool is a Saber circuit simulation tool.

18. The system as recited in claim 9 wherein the segment identifier includes a zero DC voltage source.

19. The system as recited in claim 9 wherein the segment identifier includes a resistor having negligible resistance.

\* \* \* \* \*